(12) United States Patent
Kim (10) Patent No.: US 8,803,325 B2
(45) Date of Patent: Aug. 12, 2014

(54) STACKED SEMICONDUCTOR PACKAGE (75) Inventor: Seong Cheol Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 51 days.

(21) Appl. No.: 13/613,983

(22) Filed: Sep. 13, 2012

(65) Prior Publication Data

US 2013/0292842 A1    Nov. 7, 2013

(30) Foreign Application Priority Data

May 3, 2012    (KR) .......................... 10-2012-0047063

(51) Int. Cl.
*H01L 23/538*    (2006.01)
(52) U.S. Cl.
USPC .......................................................... 257/774
(58) Field of Classification Search
USPC ................................................ 257/678, 774
See application file for complete search history.

(56) References Cited

U.S. PATENT DOCUMENTS

2011/0050320 A1* 3/2011 Gillingham .................... 327/365
2011/0215438 A1* 9/2011 Kwang et al. ................. 257/531

FOREIGN PATENT DOCUMENTS

KR    1020110016023 A    2/2011

* cited by examiner

*Primary Examiner* — Whitney T Moore
(74) *Attorney, Agent, or Firm* — William Park & Associates Patent Ltd.

(57) ABSTRACT

A stacked semiconductor package includes a plurality of semiconductor chips each including a substrate having one surface, the other surface which faces away from the one surface and side surfaces which connect the one surface and the other surface, through-silicon vias which pass through the one surface and the other surface of the substrate, repair pads which are exposed on the side surfaces of the substrate, and wiring lines which electrically connect the through-silicon vias with the repair pads, the plurality of semiconductor chips being stacked such that through-silicon vias of the semiconductor chips are connected with one another; and interconnections electrically connecting the repair pads of the semiconductor chips.

17 Claims, 9 Drawing Sheets

STACKED SEMICONDUCTOR PACKAGE

CROSS-REFERENCE TO RELATED APPLICATION

The present application claims priority to Korean patent application number 10-2012-47063 filed May 3, 2012, in the Korean Intellectual Property Office, which is incorporated herein by reference in its entirety.

BACKGROUND OF THE INVENTION

1. Field of Invention

The present invention relates to a stacked semiconductor package, and more particularly, to a stacked semiconductor package using through-silicon vias.

2. Description of the Related Art

Packaging technologies for a semiconductor device have been continuously developed according to demands toward is miniaturization and high capacity, and recently, various technologies for a stacked semiconductor package capable of satisfying miniaturization, high capacity and mounting efficiency are being developed.

The term "stack" that is referred to in the semiconductor industry means a technology of vertically piling at least two semiconductor chips or semiconductor packages. In the case of a memory device, by using a stacking technology, it is possible to realize a product having memory capacity larger than that obtainable through semiconductor integration processes and improve mounting area utilization efficiency.

Among stacked semiconductor packages, a stacked semiconductor package using through-silicon vias has a structure in which through-silicon vias are formed in semiconductor chips and the semiconductor chips are stacked in such a way as to be electrically connected through the through-silicon vias. In the stacked semiconductor package using the through-silicon vias, since electrical connections are formed using through-silicon vias, advantages are provided in that an operation speed can be improved and miniaturization is possible.

However, if a connection failure occurs between the through-silicon vias of the stacked semiconductor chips, signal transfer becomes impossible and the entire stacked semiconductor package cannot be used. As a consequence, manufacturing yield is may markedly decrease.

BRIEF SUMMARY OF THE INVENTION

An embodiment of the present invention is directed to a stacked semiconductor package suitable for improving manufacturing yield.

In one embodiment of the present invention, a stacked semiconductor package includes: a plurality of semiconductor chips each including a substrate having one surface, the other surface which faces away from the one surface and side surfaces which connect the one surface and the other surface, through-silicon vias which pass through the one surface and the other surface of the substrate, repair pads which are exposed on the side surfaces of the substrate, and wiring lines which electrically connect the through-silicon vias with the repair pads, the plurality of semiconductor chips being stacked such that through-silicon vias of the semiconductor chips are connected with one another; and interconnections electrically connecting the repair pads of the semiconductor chips.

The through-silicon vias of any one upper semiconductor chip among the plurality of stacked semiconductor chips and at least any one of the through-silicon vias of a semiconductor chip placed immediately below the upper semiconductor chip may or may not be electrically connected with each other.

The interconnections may be formed on the side surfaces is of the stacked semiconductor chips.

The stacked semiconductor package may further include a molding part sealing an upper surface of the stacked semiconductor chips and the side surfaces of the stacked semiconductor chips including the interconnections. Further, the stacked semiconductor package may further include first additional interconnections formed in the molding part, and having one ends which are electrically connected with the interconnections and the other ends which face away from the one ends and are exposed out of the molding part. The stacked semiconductor package may further include second additional interconnections formed on the molding part and electrically connecting the other ends of the first additional interconnections which are exposed out of the molding part.

The stacked semiconductor package may further include a molding part covering an upper surface and side surfaces of the stacked semiconductor chips.

The interconnections may include: first interconnections formed in the molding part and having one ends which are electrically connected with the repair pads of the respective semiconductor chips and the other ends which face away from the one ends and are exposed out of the molding part; and second interconnections formed on the molding part and electrically connecting the other ends of the first interconnections which are exposed out of the molding part.

The interconnections may be electrically connected with the repair pads of some semiconductor chips among the stacked semiconductor chips. Unlike this, the interconnections may be electrically connected with the repair pads of all the stacked semiconductor chips.

The repair pads may be formed to be exposed on the side surfaces of the substrate on edges of the one surface of the substrate, and the wiring lines may be formed on the one surface of the substrate. Each of the semiconductor chips may further include a protective layer which is formed on the one surface of the substrate in such a way as to cover the wiring lines and leave exposed the repair pads and the through-silicon vias.

The repair pads may be formed on the side surfaces of the substrate, and the wiring lines are formed in the substrate.

The stacked semiconductor package may further include: conductive connection members formed between the through-silicon vias of the stacked semiconductor chips; and adhesive members formed between the stacked semiconductor chips.

The stacked semiconductor package may further include: a first dielectric layer formed under a lower surface of a lowermost semiconductor chip among the stacked semiconductor chips in such a way as to leave exposed the through-silicon vias of the lowermost semiconductor chip; redistribution lines formed under the first dielectric layer and electrically connected with the through-silicon vias of the lowermost semiconductor chip; and a second dielectric layer formed under the first dielectric layer including the redistribution lines in such a way as to leave exposed portions of the redistribution lines. Besides, the stacked semiconductor package may further include external connection terminals mounted to the portions of the redistribution lines exposed through the second dielectric layer.

The stacked semiconductor package may further include a structural body supporting the semiconductor chips and having connection electrodes which are electrically connected with the through-silicon vias of the lowermost semiconductor chip among the stacked semiconductor chips. The structural body may include any one of a printed circuit board, an interposer and a semiconductor package.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
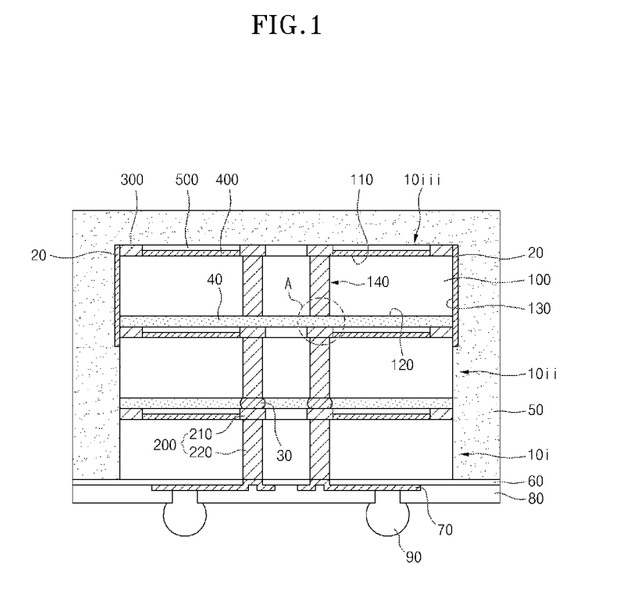
FIG. 1 is a cross-sectional view illustrating a stacked semiconductor package in accordance with an embodiment of the present invention.
Figure 2:
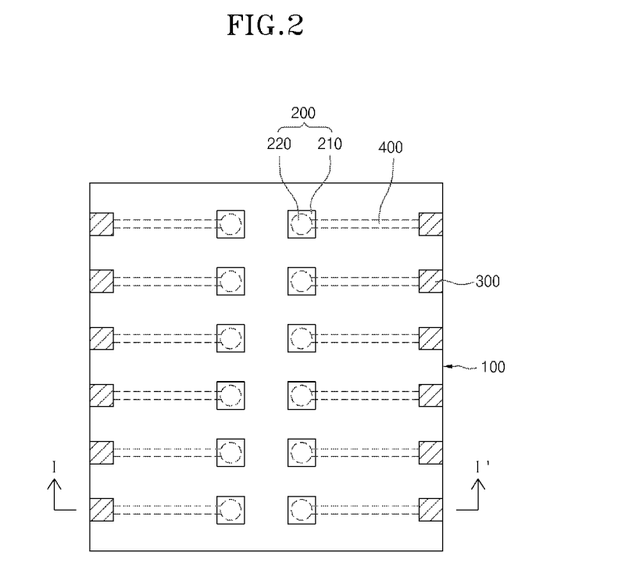
FIG. 2 is a plan view illustrating the semiconductor chip shown in FIG. 1.
Figure 3:
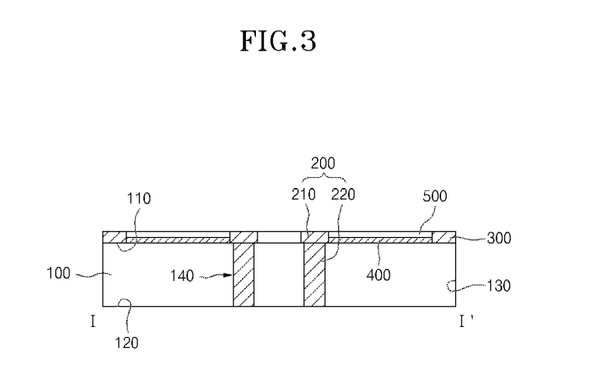
FIG. 3 is a cross-sectional view taken along the line I-I' of FIG. 2.

FIG. 1 is a cross-sectional view illustrating a stacked semiconductor package in accordance with an embodiment of the present invention, FIG. 2 is a plan view illustrating the semiconductor chip shown in FIG. 1, and FIG. 3 is a cross-sectional view taken along the line I-I' of FIG. 2.

Referring to FIG. 1, the stacked semiconductor package in accordance with an embodiment of the present invention includes a plurality of semiconductor chips 10i to 10iii, and interconnections 20. The stacked semiconductor package may further include conductive connection members 30, adhesive members 40, a molding part 50, first and second dielectric layers 60 and 80, redistribution lines 70, and external connection terminals 90.

Referring to FIGS. 2 and 3, each of the semiconductor chips 10i to 10iii includes a substrate 100, through-silicon vias 200, repair pads 300, and wiring lines 400. Each of the semiconductor chips 10i to 10iii may further include a protective layer 500.

The substrate 100 includes one surface 110, an other surface 120, side surfaces 130, through holes 140, and a circuit unit (not shown).

The one surface 110 faces away from the other surface 120, and the side surfaces 130 connect the one surface 110 and the other surface 120. The through holes 140 are defined to pass through the one surface 110 and the other surface 120 of the substrate 100. In the present embodiment, a plurality of through holes 140 is arranged in each of two lines along a center portion of the substrate 100 when viewed from the top. A dielectric layer (not shown) is formed on the inner surfaces of the substrate 100 which are formed due to defining of the through holes 140. The dielectric layer may include any one of an oxide layer and a nitride layer. On the other hand, the dielectric layer may include an organic layer.

The circuit unit is disposed at a center portion of the substrate 100, and include, for example, transistors capacitors, resistors, etc. for storing and processing data.

In the present embodiment, the through-silicon vias 200 include connection parts 210 and through parts 220.

The connection parts 210 are formed on the one surface 110 of the substrate 100 and may overlap with the through holes 140. The through parts 220 are formed in the through holes 140. One ends of the through parts 220 are connected with the connection parts 210, and other ends of the through parts 220 facing away from the one ends are exposed on the other surface 120 of the substrate 100. A substance used as the through-silicon vias 200 may include at least any one selected from the group consisting of copper, aluminum, an aluminum alloy and a metal alloy.

The repair pads 300 are formed adjacent to the edges of the one surface 110 of the substrate 100 in such a way as to be exposed on the side surfaces 130 of the substrate 100.

The wiring lines 400 electrically connect the through-silicon vias 200 and the repair pads 300. In the present embodiment, the wiring lines 400 are formed on the one surface 110 of the substrate 100. One ends of the wiring lines 400 are connected with the connection parts 210 of the through-silicon vias 200, and other ends of the wiring lines 400 facing away from the one ends are connected with the repair pads 300.

The protective layer 500 is formed on the one surface 110 of the substrate 100 in such a way as to cover the wiring lines 400 and leave exposed the repair pads 300 and leave exposed the connection parts 210. The protective layer 500 may be any one of an oxide layer and a nitride layer. Unlike this, the protective layer 500 may be an organic layer.

Referring back to FIG. 1, the plurality of semiconductor chips 10i to 10iii are stacked such that their through-silicon vias 200 are connected with one another.

The interconnections 20 are formed on the side surfaces 13 of the stacked semiconductor chips 10i to 10iii and electrically connect the repair pads 300 of the semiconductor chips 10i to 10iii.

In the present embodiment, the interconnections 20 are electrically connected with the repair pads 300 of some semiconductor chips 10ii and 10iii among the stacked semiconductor chips 10i to 10iii. The interconnections 20, however, may be electrically connected with the repair pads 300 of all the stacked semiconductor chips 10i to 10iii.

The conductive connection members 30 are formed between the through-silicon vias 200 of the stacked semiconductor chips 10i to 10iii and electrically connect the through-silicon vias 200 of the semiconductor chips 10i to 10iii. The adhesive members 40 are formed between the stacked semiconductor chips 10i to 10iii and attach the stacked semiconductor chips 10i to 10iii. The conductive connection members 30 may include solders, and the adhesive members 40 may include non-conductive pastes.

Here, as shown by the part A, the conductive connection members 30 may or may not be formed between the through-silicon vias 200 of some semiconductor chips 10ii and 10iii among the stacked semiconductor chips 10i to 10iii, and accordingly, connection failures may occur in the through-silicon vias 200 of the semiconductor chips 10ii and 10iii that are not connected with each other with conductive connection members 30. However, because the through-silicon vias 200 of the semiconductor chip 10ii are electrically connected with the through-silicon vias 200 of the semiconductor chip 10iii by the wiring lines 400 the repair pads 300 and the interconnections 20, signal transfer may be normally is carried out even when the connection failures occur between the through-silicon vias 200. That is to say, the connection failures occur between the through-silicon vias 200 are repaired.

The molding part 50 seals the upper surface of the stacked semiconductor chips 10i to 10iii and the side surfaces of the semiconductor chips 10i to 10iii including the interconnections 20. The molding part 50 may include an epoxy molding compound (EMC).

The first dielectric layer 60 is formed on the lower surface of the lowermost semiconductor chip 10i among the stacked semiconductor chips 10i to 10iii and on the molding part 50 in such a way to leave exposed the through-silicon vias 200 of the lowermost semiconductor chip 10i. The redistribution lines 70 may be formed on a bottom surface of the first dielectric layer 60 and thus the redistribution lines 70 may be under the first dielectric layer 60. The redistribution lines 70 may be formed to be electrically connected with the through-silicon vias 200 of the lowermost semiconductor chip 10i. The second dielectric layer 80 may be formed on the bottom surface of the first dielectric layer 60 and thus the second dielectric layer 80 may be formed under the first dielectric layer 60. The second dielectric layer 80 may be formed in such a way as to leave exposed portions of the redistribution lines 70. The external connection terminals 90 may be mounted to the portions of the redistribution lines 70 which remain is exposed through the second dielectric layer 80. The external connection terminals 90 may include solder balls.

Figure 4:
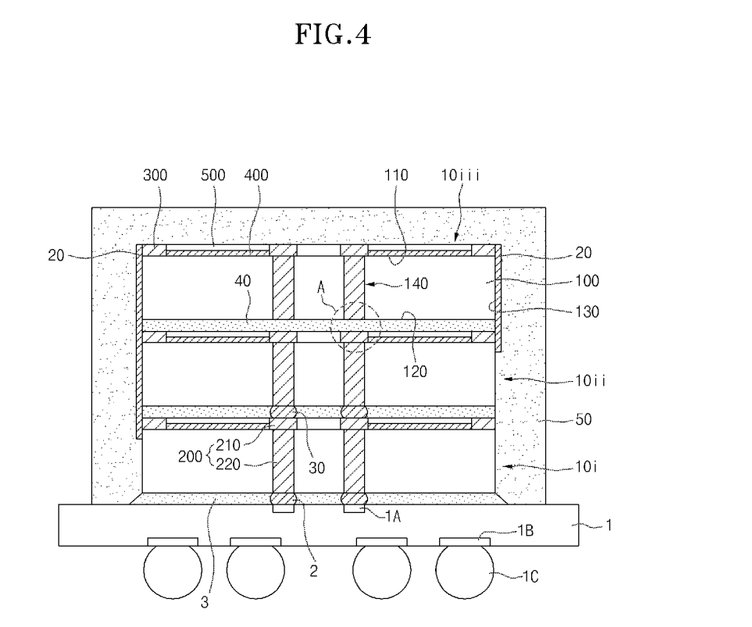
FIG. 4 is a cross-sectional view illustrating a stacked semiconductor package in accordance with an embodiment of the is present invention.

FIG. 4 is a cross-sectional view illustrating a stacked semiconductor package in accordance with an embodiment of the present invention.

Referring to FIG. 4, the stacked semiconductor package in accordance with an embodiment of the present invention includes a structural body 1 having connection electrodes 1A which are electrically connected with through-silicon vias 200 of a lowermost semiconductor chip 10i. The structural body 1 may be included in place of the first and second dielectric layers 60 and 80, the redistribution lines 70 and the external connection terminals 90 included in the stacked semiconductor package depicted in FIGS. 1-3. In the present embodiment, the structural body 1 is formed as a printed circuit board.

The through-silicon vias 200 of the lowermost semiconductor chip 10i and the connection electrodes 1A of the structural body 1 are electrically connected by conductive connection members 2. Further, in order to improve the reliability of a joint part, an underfill member 3 is filled between the lowermost semiconductor chip 10i and the structural body 1. In FIG. 4, the reference numeral 1B may designate ball lands, and the reference number 1c may designate external connection terminals 90 mounted to the ball lands 1B.

While it was described in the embodiment shown in FIG. 4 that the structural body 1 includes a printed circuit board, it is to be noted that the structural body 1 may include a semiconductor package or an interposer.

Figure 5:
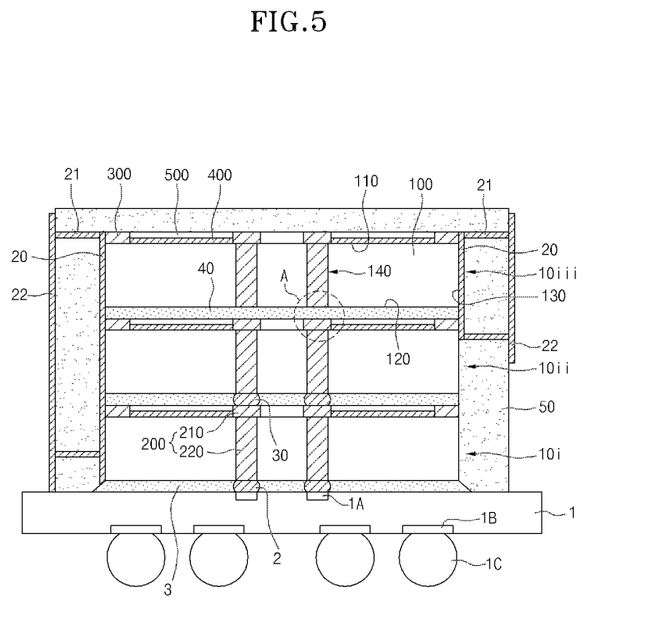
FIG. 5 is a cross-sectional view illustrating a stacked semiconductor package in accordance with an embodiment of the present invention.

FIG. 5 is a cross-sectional view illustrating a stacked semiconductor package in accordance with an embodiment of the present invention.

The stacked semiconductor package in accordance with the embodiment of the present invention depicted in FIG. 5 has a construction that first additional interconnections 21 and second additional interconnections 22 are added to the stacked semiconductor package in accordance with the embodiment of the present invention described above with reference to FIG. 4. Accordingly, the stacked semiconductor package in accordance with the embodiment of the present invention described with reference to FIG. 5 has substantially the same construction as the stacked semiconductor package in accordance with the embodiment of the present invention described in reference to FIG. 4 except for the first additional interconnections 21 and the second additional interconnections 22. Therefore, repeated descriptions for the same component parts will be omitted herein, and the same terms and the same reference numerals will be used to refer to the same component parts.

Referring to FIG. 5, in the present embodiment, first is additional interconnections 21 are formed in a molding part 50. One ends of the first additional interconnections 21 are electrically connected with interconnections 20, and other ends of the first additional interconnections 21 facing away from the one ends are exposed out of the molding part 50.

Second additional interconnections 22 are formed on the molding part 50 and are electrically connected with the first additional interconnections 21, where the electrical connection between the first and second additional interconnections 21 and 22 may occur at a point where the first additional interconnections 21 are left exposed between portions of the molding part 50.

According to the present embodiment, it is possible to repair a connection failure between through-silicon vias 200 of semiconductor chips 10i to 10iii even after package molding through the use of the first and second additional interconnections 21 and 22.

Figure 6:
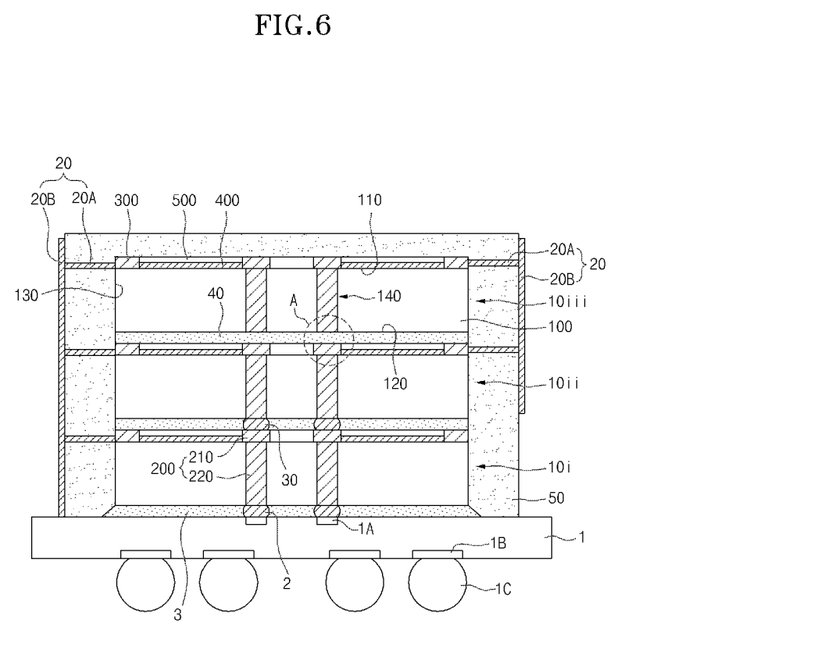
FIG. 6 is a cross-sectional view illustrating a stacked semiconductor package in accordance with an embodiment of the present invention.

FIG. 6 is a cross-sectional view illustrating a stacked semiconductor package in accordance with an embodiment of the present invention.

The stacked semiconductor package in accordance with the embodiment of the present invention described with reference to FIG. 6 has a construction where the shape of the interconnections are changed from the stacked semiconductor package in accordance with the embodiment of the present invention described above with reference to FIG. 4. Accordingly, the stacked semiconductor package in accordance with the embodiment of the present invention described with reference to FIG. 6 has substantially the same construction as the stacked semiconductor package in accordance with the second embodiment of the present invention except the interconnections 20. Therefore, repeated descriptions for the same component parts will be omitted herein, and the same terms and the same reference numerals will be used to refer to the same component parts.

Referring to FIG. 6, in the present embodiment, interconnections 20 include first interconnections 20A and second interconnections 20B.

The first interconnections 20A are formed in a molding part 50. One ends of the first interconnections 20A are electrically connected with repair pads 300 of respective semiconductor chips 10i to 10iii, and at least a portion of the other ends of the first interconnections 20A facing away from the one ends are exposed out of the molding part 50. The second interconnections 20B are electrically connected with the first interconnections 20A which remain exposed output of the molding part 50.

According to the present embodiment, it is possible to repair a connection failure between through-silicon vias 200 of semiconductor chips 10i to 10iii even after package molding.

Figure 7:
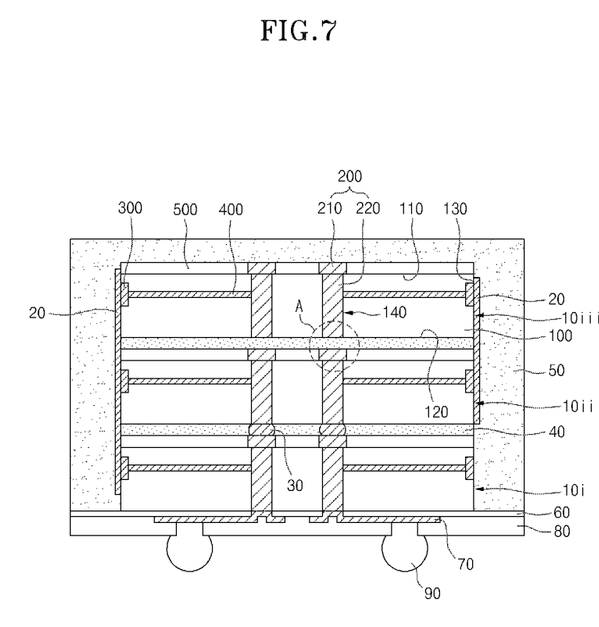
FIG. 7 is a cross-sectional view illustrating a stacked semiconductor package in accordance with an embodiment of the present invention.
Figure 8:
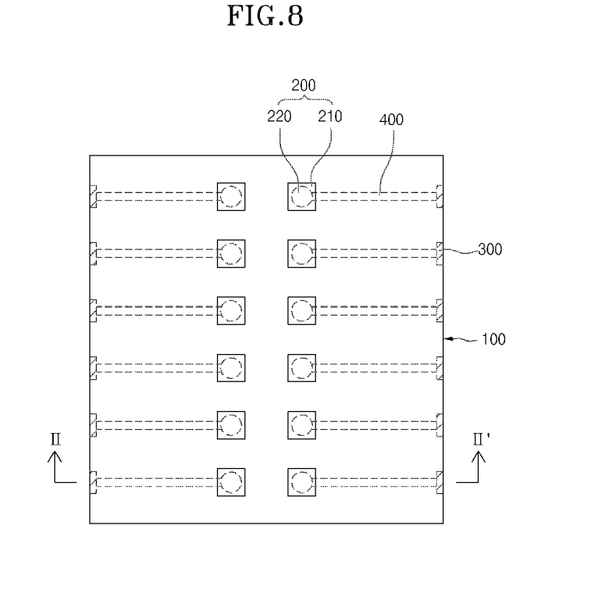
FIG. 8 is a plan view illustrating the semiconductor chip shown in FIG. 7.
Figure 9:
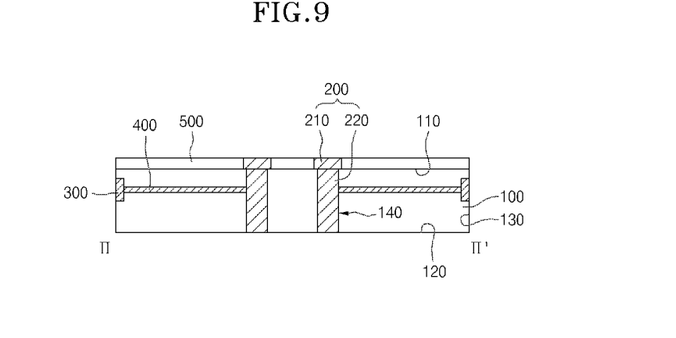
FIG. 9 is a cross-sectional view taken along the line II-II' of FIG. 8.

FIG. 7 is a cross-sectional view illustrating a stacked semiconductor package in accordance with a fifth embodiment of the present invention, FIG. 8 is a plan view illustrating the semiconductor chip shown in FIG. 7, and FIG. 9 is a cross-sectional view taken along the line II-II' of FIG. 8.

The stacked semiconductor package in accordance with an embodiment of the present invention has a construction where the shape of the semiconductor chips 10i to 10iii are changed from the stacked semiconductor package in accordance with the embodiment of the present invention described above with reference to FIGS. 1 to 3. Accordingly, the stacked semiconductor package in accordance with the fifth embodiment of the present invention has substantially the same construction as the stacked semiconductor package in accordance with the first embodiment of the present invention except the semiconductor chips 10i to 10iii. Therefore, the same terms and the same reference numerals will be used to refer to the same component parts.

Referring to FIG. 7, the stacked semiconductor package in accordance with an embodiment of the present invention includes a plurality of semiconductor chips 10i to 10iii, and interconnections 20. The stacked semiconductor package may further include conductive connection members 30, adhesive members 40, a molding part 50, first and second dielectric layers 60 and 80, redistribution lines 70, and external connection terminals 90.

Referring to FIGS. 8 and 9, each of the semiconductor chips 10i to 10iii includes a substrate 100, through-silicon vias 200, repair pads 300, and wiring lines 400. Besides, each of the semiconductor chips 10i to 10iii may further include a protective layer 500.

The substrate 100 includes one surface 110, the other surface 120, side surfaces 130, through holes 140, and a circuit unit (not shown).

The one surface 110 faces away from the other surface 120, and the side surfaces 130 connect the one surface 110 and the other surface 120. The through holes 140 are defined to pass through the one surface 110 and the other surface 120 of the substrate 100. In the present embodiment, a plurality of through holes 140 are arranged in each of two lines along the center portion of substrate 100 when viewed from the top. A dielectric layer (not shown) is formed on inner surfaces of the substrate 100 defined by the through holes 140. The dielectric layer may include any one of an oxide layer and a nitride layer. In other embodiments, the dielectric layer may include an organic layer. The circuit unit is disposed at a center portion of the substrate 100, and include, for example, transistors capacitors, resistors, etc. for storing and processing data.

In the present embodiment, the through-silicon vias 200 include connection parts 210 and through parts 220.

The connection parts 210 are formed on the one surface 110 of the substrate 100 to overlap with the through holes 140. The through parts 220 are formed in the through holes 140. One ends of the through parts 220 are connected with the connection parts 210 on the one surface 110 of the substrate 100, and the other ends of the through parts 220 facing away from the one ends are exposed on the other surface 120 of the substrate 100. A substance used as the through-silicon vias 200 may include at least any one selected from the group consisting of copper, aluminum, an aluminum alloy and a metal alloy.

The repair pads 300 are formed on the side surfaces 130 of the substrate 100.

The wiring lines 400 electrically connect the through-silicon vias 200 and the repair pads 300. In the present embodiment, the wiring lines 400 are formed in the substrate 100. One ends of the wiring lines 400 are connected with the through parts 220 of the through-silicon vias 200, and the other ends of the wiring lines 400 facing away from the one ends are connected with the repair pads 300.

The protective layer 500 is formed on the one surface 110 of the substrate 100 in such a way as to leave exposed the connection parts 210 of the through-silicon vias 200. The protective layer 500 may be any one of an oxide layer and a nitride layer. The protective layer 500 may also be an organic layer.

Referring back to FIG. 7, the plurality of semiconductor chips 10i to 10iii are stacked such that their through-silicon vias 200 are connected with one another.

The interconnections 20 are formed on the side surfaces 13 of the stacked semiconductor chips 10i to 10iii and electrically connect the repair pads 300 of the semiconductor chips 10i to 10iii.

In the present embodiment, the interconnections 20 are electrically connected with the repair pads 300 of some semiconductor chips 10ii and 10iii among the stacked semiconductor chips 10i to 10iii. Unlike this, the interconnections 20 may be electrically connected with the repair pads 300 of all the stacked semiconductor chips 10i to 10iii.

The conductive connection members 30 are formed between the through-silicon vias 200 of the stacked semiconductor chips 10i to 10iii and electrically connect the through-silicon vias 200 of the semiconductor chips 10i to 10iii. The adhesive members 40 are formed between the stacked semiconductor chips 10i to 10iii and attach the stacked semiconductor chips 10i to 10iii to each other. The conductive connection members 30 may include solders, and the adhesive members 40 may include non-conductive pastes.

Here, as shown by the part A, the conductive connection members 30 may or may not be formed between the through-silicon vias 200 of some semiconductor chips 10ii and 10iii among the stacked semiconductor chips 10i to 10iii. In other words, connection failures may occur when the through-silicon vias 200 of is the semiconductor chips 10ii and 10iii are not connected with each other. However, because the through-silicon vias 200 of the semiconductor chip 10ii are electrically connected with the through-silicon vias 200 of the semiconductor chip 10iii through the wiring lines 400, the repair pads 300 and the interconnections 20, signal transfer may be normally carried out even when connection failures occur between the through-silicon vias 200. That is to say, the connection failures that occur between the through-silicon vias 200 are repaired.

The molding part 50 seals the upper surface of the stacked semiconductor chips 10i to 10iii and the side surfaces of the semiconductor chips 10i to 10iii including the interconnections 20. The molding part 50 may include an epoxy molding compound (EMC).

The first dielectric layer 60 is formed on the lower surface of the lowermost semiconductor chip 10i among the stacked semiconductor chips 10i to 10iii and on the molding part 50 in such a way to leave exposed the through-silicon vias 200 of the lowermost semiconductor chip 10i, and the redistribution lines 70 are formed on the first dielectric layer 60. The redistribution lines 70 may be electrically connected with the through-silicon vias 200 of the lowermost semiconductor chip 10i. The second dielectric layer 80 is formed on the first dielectric layer 60 including the redistribution lines 70 in such a way as to leave exposed portions of is the redistribution lines 70. The external connection terminals 90 are mounted to the portions of the redistribution lines 70 which are exposed through the second dielectric layer 80. The external connection terminals 90 may include solder balls.

Figure 10:
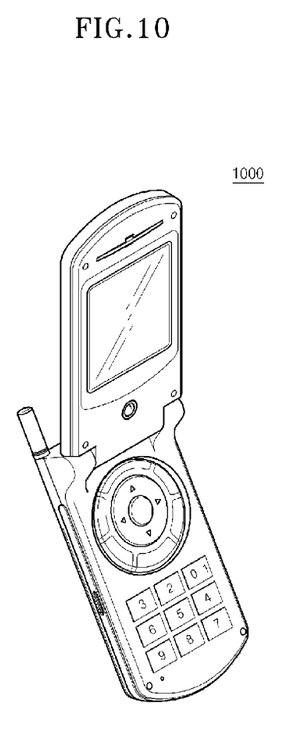
FIG. 10 is a perspective view illustrating an electronic apparatus having the stacked semiconductor package according to an embodiment of the present invention.

FIG. 10 is a perspective view illustrating an electronic apparatus having the stacked semiconductor package according to the present invention.

Referring to FIG. 10, the stacked semiconductor package according to the embodiments of the present invention may be applied to an electronic apparatus 1000 such as a portable phone. Since the stacked semiconductor package according to the embodiments of the present invention can improve the manufacturing yield, advantages are provided for improving the reliability of the electronic apparatus 1000. The electronic apparatus 1000 is not limited to the portable phone shown in FIG. 10, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 11:
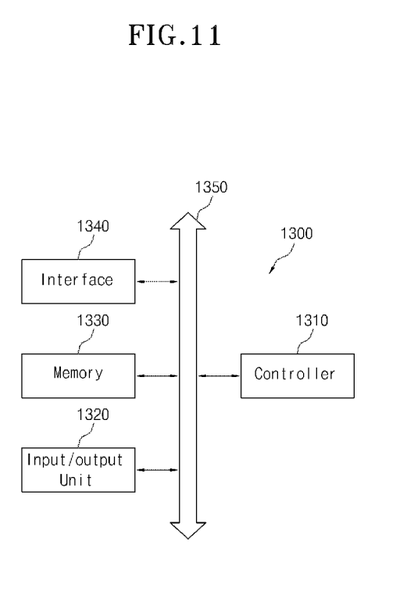
FIG. 11 is a block diagram showing an example of the electronic apparatus having the stacked semiconductor package according to an embodiment of the present invention.

FIG. 11 is a block diagram showing an example of the electronic apparatus having the stacked semiconductor package according to the present invention.

Referring to FIG. 11, an electronic system 1300 may is include a controller 1310, an input/output unit 1320, and a memory 1330. The controller 1310, the input/output unit 1320 and the memory 1330 may be coupled with one another through a bus 1350. The bus 1350 serves as a path through which data moves. For example, the controller 1310 may include at least any one of at least one microprocessor, at least one digital signal processor, at least one microcontroller, and logic devices capable of performing the same functions as these components. The controller 1310 and the memory 1330 may include the stacked semiconductor package according to the present invention. The input/output unit 1320 may include at least one selected from among a keypad, a keyboard, a display device, and so forth. The memory 1330 is a device for storing data. The memory 1330 may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the present invention is applied may be mounted to an information processing system such as a mobile terminal or a desktop computer. The flash memory may be constituted by a solid state drive (SSD). In this case, the electronic system 1300 may stably store a large amount of data in a flash memory system. The electronic system 1300 may further include an interface 1340 configured to transmit and receive data to and from a is communication network. The interface 1340 may be a wired or wireless type. For example, the interface 1340 may include an antenna or a wired or wireless transceiver. Further, while not shown, a person skilled in the art will readily appreciate that the electronic system 1300 may be additionally provided with an application chipset, a camera image processor (CIS), an input/output unit, etc.

As is apparent from the above description, according to the embodiments of the present invention, even when a connection failure occurs between through-silicon vias of stacked semiconductor chips, since signal transfer is made possible through interconnections and thus a connection failure between through-silicon vias can be repaired, the manufacturing yield may be improved. In addition, because a connection failure between through-silicon vias may be repaired even after package molding, not only a connection failure occurring before package molding but also a connection failure occurring after package molding can be repaired, whereby the manufacturing yield may be further improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stacked semiconductor package comprising:
    a plurality of semiconductor chips each including a substrate having one surface, the other surface which faces away from the one surface and side surfaces which connect the one surface and the other surface, through-silicon vias which pass through the one surface and the other surface of the substrate, repair pads which are exposed on the side surfaces of the substrate, and wiring lines which electrically connect the through-silicon vias with the repair pads, the plurality of semiconductor chips being stacked such that through-silicon vias of the semiconductor chips are connected with one another; and
    interconnections electrically connecting the repair pads of the semiconductor chips; and
    conductive connection members formed between the through-silicon vias of the stacked semiconductor chips; and
    adhesive members formed between the stacked semiconductor chips.

2. The stacked semiconductor package according to claim 1, wherein the through-silicon vias of any one upper semiconductor chip among the plurality of stacked semiconductor chips and at least any one of the through-silicon vias of a semiconductor chip placed immediately below the upper semiconductor chip are not electrically connected with each other.

3. The stacked semiconductor package according to claim 1, wherein the interconnections are formed on the side surfaces of the stacked semiconductor chips.

4. The stacked semiconductor package according to claim 3, further comprising:
    a molding part sealing an upper surface of the stacked semiconductor chips and the side surfaces of the stacked semiconductor chips including the interconnections.

5. The stacked semiconductor package according to claim 4, further comprising:
    first additional interconnections formed in the molding part, and having one ends which are electrically connected with the interconnections and other ends which face away from the one ends and are exposed out of the molding part.

6. The stacked semiconductor package according to claim 5, further comprising:
    second additional interconnections formed on the molding part and electrically connecting the other ends of the first additional interconnections which are exposed out of the molding part.

7. The stacked semiconductor package according to claim 1, further comprising:
    a molding part covering an upper surface and side surfaces of the stacked semiconductor chips.

8. The stacked semiconductor package according to claim 7, wherein the interconnections comprise:
  first interconnections formed in the molding part and having one ends which are electrically connected with the repair pads of the respective semiconductor chips and other ends which face away from the one ends and are exposed out of the molding part; and
  second interconnections formed on the molding part and electrically connecting the other ends of the first interconnections which are exposed out of the molding part.

9. The stacked semiconductor package according to claim 1, wherein the interconnections are electrically connected with the repair pads of some semiconductor chips among the stacked semiconductor chips.

10. The stacked semiconductor package according to claim 1, wherein the interconnections are electrically connected with the repair pads of all the stacked semiconductor chips.

11. The stacked semiconductor package according to claim 1, wherein the repair pads are formed to be exposed on the side surfaces of the substrate on edges of the one surface of the substrate, and the wiring lines are formed on the one surface of the substrate.

12. The stacked semiconductor package according to claim 11, wherein each of the semiconductor chips further includes a protective layer which is formed on the one surface of the substrate in such a way as to cover the wiring lines and leave exposed the repair pads and the through-silicon vias.

13. The stacked semiconductor package according to claim 1, wherein the repair pads are formed on the side surfaces of the substrate, and the wiring lines are formed in the substrate.

14. The stacked semiconductor package according to claim 1, further comprising:
  a first dielectric layer formed under a lower surface of a lowermost semiconductor chip among the stacked semiconductor chips in such a way as to expose the through-silicon vias of the lowermost semiconductor chip;
  redistribution lines formed under the first dielectric layer and electrically connected with the through-silicon vias of the lowermost semiconductor chip; and
  a second dielectric layer formed under the first dielectric layer including the redistribution lines in such a way as to expose portions of the redistribution lines.

15. The stacked semiconductor package according to claim 14, further comprising:
  external connection terminals mounted to the portions of the redistribution lines exposed through the second dielectric layer.

16. The stacked semiconductor package according to claim 1, further comprising:
  a structural body supporting the semiconductor chips and having connection electrodes which are electrically connected with the through-silicon vias of the lowermost semiconductor chip among the stacked semiconductor chips.

17. The stacked semiconductor package according to claim 16, wherein the structural body comprises any one of a printed circuit board, an interposer and a semiconductor package.

* * * * *